United States Patent
Lee et al.

(10) Patent No.: US 8,278,180 B2
(45) Date of Patent: Oct. 2, 2012

(54) METHODS OF FORMING A SEMICONDUCTOR DEVICE HAVING A CONTACT STRUCTURE

(75) Inventors: Changhun Lee, Ansan-si (KR);
Keemoon Chun, Seongnam-si (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 108 days.

(21) Appl. No.: 12/871,273

(22) Filed: Aug. 30, 2010

(65) Prior Publication Data

US 2011/0151658 A1    Jun. 23, 2011

(30) Foreign Application Priority Data

Dec. 22, 2009  (KR) .................. 10-2009-0128919

(51) Int. Cl.
*H01L 21/331* (2006.01)
*H01L 21/461* (2006.01)
*H01L 21/302* (2006.01)

(52) U.S. Cl. .................. 438/311; 438/724; 438/744

(58) Field of Classification Search .................. 438/331, 438/724, 744
See application file for complete search history.

(56) References Cited

U.S. PATENT DOCUMENTS

| 4,843,034 | A  | * | 6/1989  | Herndon et al. | ............. 438/622 |
| 5,087,589 | A  | * | 2/1992  | Chapman et al. | ............ 438/467 |
| 6,432,844 | B1 | * | 8/2002  | Farrar | .......................... 438/783 |
| 6,495,919 | B2 |   | 12/2002 | Farrar |  |

FOREIGN PATENT DOCUMENTS

| KR | 100166856 | 9/1998 |
| KR | 10-0396693 | 8/2003 |

OTHER PUBLICATIONS

English Abstract for Publication No. 100166856, Sep. 24, 1998.
English Abstract for Publication No. 10-2001-0094350 (10-0396693).

* cited by examiner

*Primary Examiner* — Luan C Thai
(74) *Attorney, Agent, or Firm* — F. Chau & Associates, LLC

(57) ABSTRACT

A method of forming a semiconductor device having a contact structure includes forming an insulating layer on a semiconductor substrate, and selectively implanting impurity ions into a predetermined region of the insulating layer to generate lattice defects in the predetermined region of the insulating layer. A thermal treatment, such as quenching the insulating layer at a temperature change rate of at least −20° C./minute, is performed on the insulating layer having the lattice defects to accelerate generation of the lattice defects in the predetermined region such that a conductive region results from the generated lattice defects to provide current paths in the predetermined region.

21 Claims, 2 Drawing Sheets

USOO8278180B2

METHODS OF FORMING A SEMICONDUCTOR DEVICE HAVING A CONTACT STRUCTURE

CROSS-REFERENCE TO RELATED APPLICATION

This patent application claims under 35 U.S.C. §119 priority to and the benefit of Korean Patent Application No. 10-2009-0128919, filed on Dec. 22, 2009, the entire content of which is incorporated by reference herein.

BACKGROUND

The present disclosure herein relates to methods of forming a semiconductor device, and more particularly, to methods of forming a semiconductor device having a contact structure.

In general, semiconductor devices include an integrated circuit having specific functions. The integrated circuit is typically fabricated by forming numerous discrete devices in a limited area of a semiconductor substrate. The discrete devices may include active devices such as transistors and passive devices such as resistors and capacitors.

The discrete devices may be formed on the semiconductor substrate or on an insulating layer stacked on the semiconductor substrate. The discrete devices may be electrically connected to each other through conductive contact plugs penetrating the insulating layer and interconnection lines in contact with the contact plugs. In conventional practice the forming of the contact plugs typically includes the forming of contact holes that penetrate the insulating layer and the forming of conductive patterns that fill the contact holes.

However, as semiconductor devices become more and more highly integrated, the aspect ratio of the contact holes, that is, the ratio of the length of the hole to the width of the hole, has been increased. As a consequence, it becomes difficult to completely fill the contact holes with a conductive layer. That is, empty voids may be produced in the contact plugs formed in the contact holes. When the voids are formed in the contact plugs, the voids may sharply increase the contact resistance between the respective contact plugs in the contact holes and the interconnection lines in contact with the contact plugs. Moreover, such voids can degrade the reliability of the semiconductor devices, particularly if such voids create potential gaps/disconnects in the current paths between the contact plugs and the interconnection lines.

SUMMARY

In accordance with an exemplary embodiment of the present inventive concept a method of forming a semiconductor device is provided. An insulating layer is formed on a semiconductor substrate. Impurity ions are selectively implanted into a predetermined region of the insulating layer to generate lattice defects in the predetermined region of the insulating layer. A conductive region is formed having current paths in the predetermined region by performing a thermal treatment on the insulating layer having the lattice defects to accelerate generation of the lattice defects in the predetermined region.

In accordance with an exemplary embodiment of the present inventive concept a method of forming a current path in an insulating layer of a semiconductor device includes implanting impurity ions into the insulating layer to provoke initial lattice defects in areas where the ions are implanted such that the initial lattice defects provide a current path within the insulating layer.

A thermal treatment process may be further applied to the areas where the ions are implanted to accelerate generation of further lattice defects in the areas where the ions are implanted, such that the initial lattice defects and the further lattice defects provide a current path through the insulating layer.

The insulating layer may be one of a silicon oxide layer, a silicon nitride layer, and a silicon oxynitride layer.

Selective implanting of impurity ions into the predetermined region of the insulating layer may include forming a mask pattern on the insulating layer and having an opening which exposes the predetermined region, implanting the impurity ions into the predetermined region through the opening, and removing the mask pattern.

The impurity ions may include phosphorus ions, arsenic ions, boron ions, fluorine ions.

The impurity ions may be implanted by an electron beam.

Quenching the insulating layer may include immersing the semiconductor substrate having the insulating layer in de-ionized water.

The thermal treatment may include loading the semiconductor substrate having the insulating layer in which the impurity ions are implanted into a diffusion furnace, heating the insulating layer in the diffusion furnace, and unloading the heated insulating layer.

The unloading of the heated insulating layer may include adjusting a movement speed of the semiconductor substrate having the heated insulating layer to quench the insulating layer at a temperature change rate of at least −20° C./minute.

A conductive layer may be formed on the insulating layer having the conductive region and the conductive layer may be patterned to form an interconnection line which is in contact with the conductive region.

A metal-oxide-semiconductor (MOS) transistor having a gate electrode, a source region, and a drain region may be formed on the semiconductor substrate prior to the formation of the insulating layer. The predetermined region having the lattice defects may be in contact with any one of the gate electrode, the source region, and the drain region.

The insulating layer may have a first surface on which a contact plug is located and an opposing surface interfacing with an impurity region of a MOS transistor, wherein the current path may interconnect the contact plug to the impurity region.

The impurity ions may be implanted using multiple ion implantation processes with ion implantation energies different from each other.

The differing energies may be provided such that the initial lattice defects and further lattice defects are created at differing distances from a source of the impurity ion implantation.

The thermal treatment process may include quenching the insulating layer at a temperature change rate of at least −20° C./minute.

The thermal treatment process may include heating the insulating layer to a temperature higher than room temperature and then immersing the heated insulating layer in de-ionized cooling water having a room temperature or a temperature lower than room temperature.

BRIEF DESCRIPTION OF THE DRAWINGS

The accompanying drawings are included to provide a further understanding of the inventive concept and illustrate exemplary embodiments of the inventive concept and, together with the description, serve to explain the principles of the inventive concept.

DETAILED DESCRIPTION OF THE EMBODIMENTS

Figure 1:
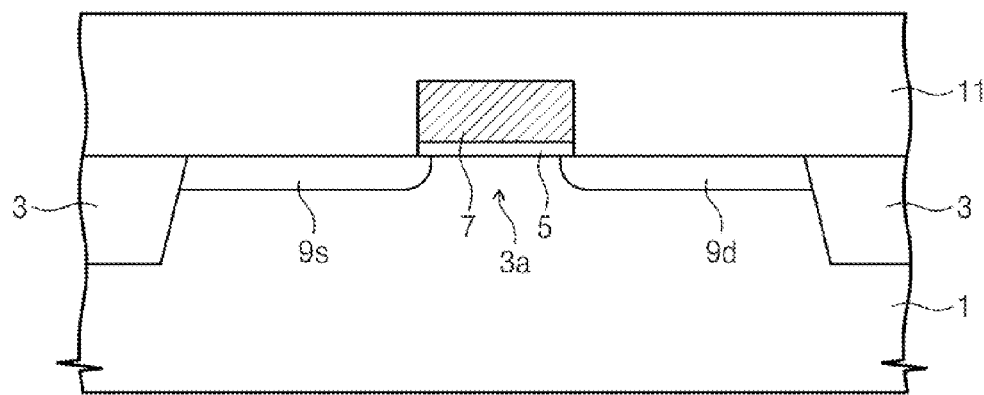
FIGS. 1, 2, 3 and 4 of the drawings are cross-sectional views illustrating methods of forming a semiconductor device according to exemplary embodiments of the inventive concept.

The exemplary embodiments of the inventive concept are provided so that this disclosure will be thorough and complete and will fully convey the scope of the inventive concept to those skilled in the art. In the drawings, the thickness of layers and regions is exaggerated to effectively describe technical details. Like reference numerals refer to like elements throughout the specification.

Referring first to FIG. 1, a device isolation layer 3 is formed in a portion of a semiconductor substrate 1 to define an active region 3a. A MOS transistor is formed at the active region 3a. The MOS transistor is formed to have a gate electrode 7, a source region 9s, and a drain region 9d. The gate electrode 7 is electrically insulated from the active region 3a by a gate insulating layer 5. An insulating layer 11 is formed on the surface of the substrate with the MOS transistor. The insulating layer 11 may include at least one of a silicon oxide layer (SiO), a silicon nitride layer (SiN), and a silicon oxynitride layer (SiON).

Figure 2:
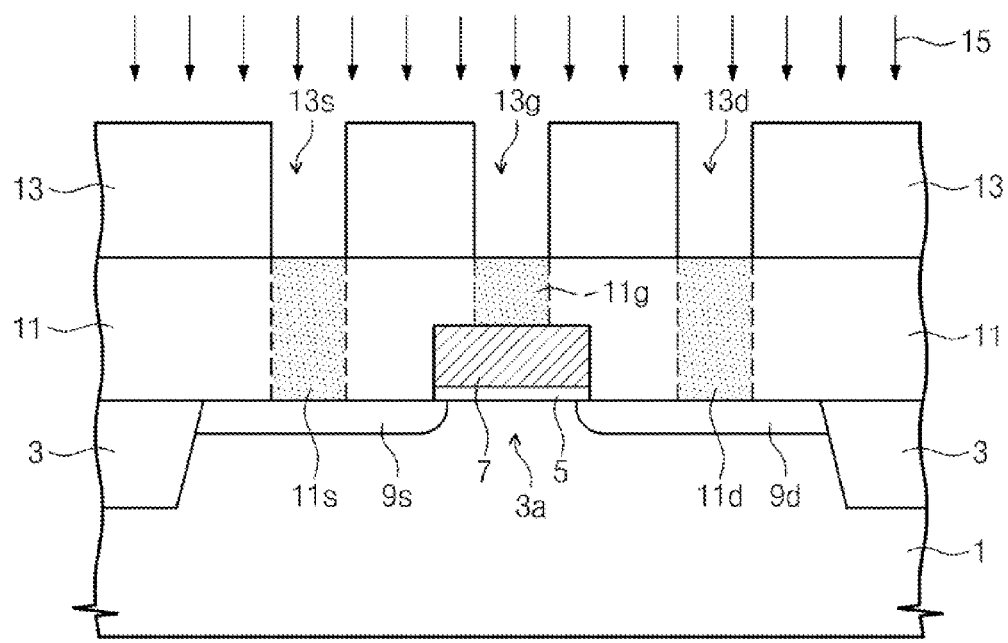

Referring to FIG. 2, a mask pattern 13 is formed on the insulating layer 11. The mask pattern 13 may be formed of a photoresist layer. The mask pattern 13 may include at least one opening which penetrates the mask pattern 13. For example, the mask pattern 13 may include a first opening 13g, a second opening 13s, and a third opening 13d, as illustrated in FIG. 2. In this embodiment of the inventive concept, the first mask opening 13g, the second mask opening 13s, and the third mask opening 13d may be formed above the gate electrode 7, the source region 9s, and the drain region 9d, respectively.

Impurity ions 15 are implanted into the insulating layer 11 using the mask pattern 13 as an ion implantation mask. As a consequence, a first ion implantation damage region 11g, a second ion implantation damage region 11s, and a third ion implantation damage region 11d are formed in the insulating layer 11 below the first mask opening 13g, the second mask opening 13s, and the third mask opening 13d, respectively. Each of the ion implantation damage regions 11g, 11s, 11d is intended to have lattice defects. The lattice defects in the ion implantation damage regions 11g, 11s, 11d can thereby provide current paths resulting from electrical conductance/resistance changes due to an imperfect crystal structure caused by the ion implantation. For example, interstitial defects in the insulating layer 11, i.e., atoms which occupy a site in the lattice structure at which there is usually not an atom, or two or more atoms sharing one or more lattice sites such that the number of atoms is larger than the number of lattice sites, resulting from the ion implantation, can assist in establishing the desired current paths within the insulating layer 11.

Typically, if impurity ions 15 are implanted into a semiconductor substrate or a semiconductor layer to form impurity regions such as source/drain regions of a MOS transistor, lattice defects are generated in the semiconductor substrate or the semiconductor layer. These lattice defects act as a junction leakage current path of the source/drain regions and can cause the malfunctioning of the MOS transistor. Therefore, the lattice defects generated by an ion implantation process are typically removed in a subsequent thermal treatment process. However, the embodiment of the inventive concept provides a method of intentionally forming a current path corresponding to a contact plug by creating and using lattice defects in the insulating layer. That is, the embodiment of the inventive concept provides a method of forming a conductive region in the insulating layer by intentionally increasing the lattice defects.

The impurity ions 15 may be implanted into the insulating layer 11 using ion implantation equipment that is used in fabrication of a semiconductor device. The impurity ions 15 may contain phosphorous ions, arsenic ions, boron ions, or fluorine ions. The impurity ions 15 may be implanted by electron beams.

The impurity ions 15 may be implanted with an appropriate energy such that the ion implantation damage regions 11g, 11s, 11d are in contact with the surfaces of the gate electrode 7, the source region 9s, the drain region 9d, respectively. For example, when the insulating layer 11 has a thickness greater than several thousands of angstroms (Å), the impurity ions 15 may be implanted into the insulating layer 11 by using multiple ion implantation processes having ion implantation energies different from each other. For example, stronger implantation can be used for deeper ion implantation and lattice defect creation further from the implantation source. This allows for the uniform distribution of the lattice defects in throughout the ion implantation damage regions 11g, 11s, 11d from the upper surface of the insulating layer 11 to the lower surface of the insulating layer 11.

Figure 3:
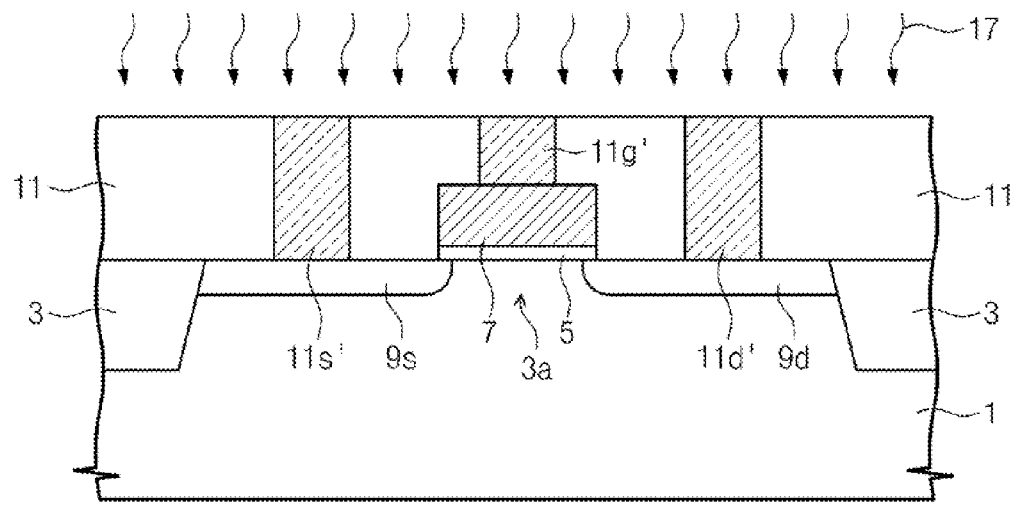

Referring to FIG. 3, the mask pattern 13 is removed. Subsequently, a thermal treatment process 17 is applied to the substrate having the ion implantation damage regions 11g, 11s, 11d to accelerate the generation of the lattice defects in the ion implantation damage regions 11g, 11s, 11d.

In an exemplary embodiment of the inventive concept, the thermal treatment process 17 may include a sequence of steps different from that of the conventional thermal treatment process for removing the lattice defects. For example, the thermal treatment process 17 may include quenching the substrate at a temperature change rate of at least −20° C./minute to accelerate the generation of the lattice defects in the ion implantation damage regions 11g, 11s, 11d.

When the mask pattern 13 is a photoresist layer, the mask pattern 13 may be removed using an oxygen plasma process. The substrate having the insulating layer with ion implantation damage regions 11g, 11s, 11d may be heated up at a temperature higher than room temperature during the oxygen plasma process. In this case, the thermal treatment process 17 may include a step of immersing the heated substrate in cooling water such as de-ionized water having a room temperature or lower.

In another embodiment of the inventive concept, the thermal treatment process 17 may include a step of loading the substrate having the mask pattern 13 removed into a diffusion furnace, a step of heating the substrate in the diffusion furnace, and a step of unloading the heated substrate out of the diffusion furnace. In this case, the step of unloading the heated substrate may be achieved by appropriately adjusting a movement speed of the substrate to rapidly quench the heated substrate at a temperature change rate of at least −20° C./minute.

The thermal treatment process 17 is not limited to the above-described embodiments of the inventive concept. That is, the thermal treatment process 17 may comprise any thermal treatment process wherein the substrate with the insulating layer having the ion implantation damage regions 11g, 11s, 11d is quenched at the temperature change rate of at least −20° C./minute.

As a consequence, the ion implantation damage regions 11g, 11s, 11d are converted to conductive regions 11g', 11s', 11d' having low electric resistance, respectively, by the above-described thermal treatment process 17, thereby providing conductive contact plugs.

Figure 4:
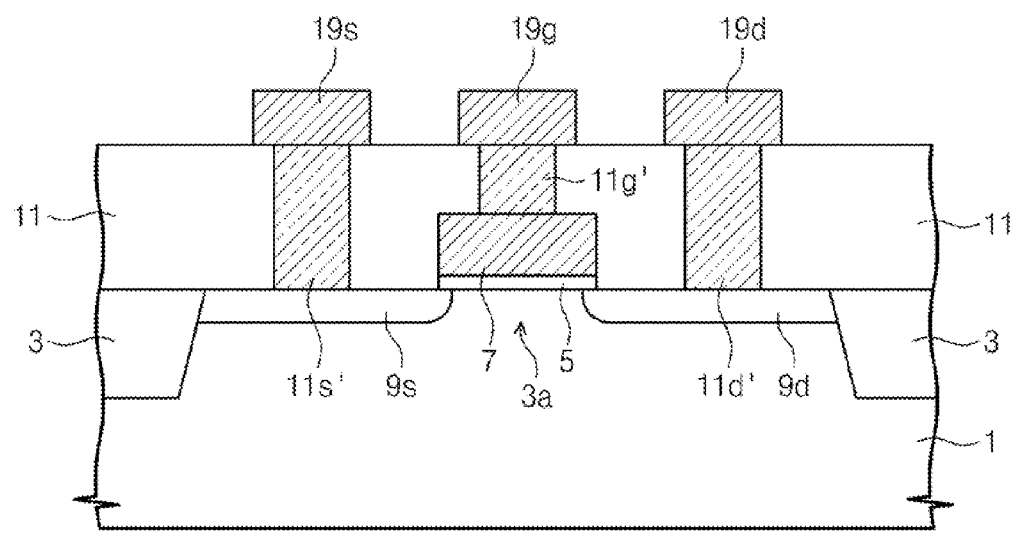

Referring to FIG. 4, after the thermal treatment process 17, a conductive layer may be formed on the insulating layer 11 and the conductive regions 11g', 11s', 11d'. The conductive layer may be patterned to form interconnection lines 19g, 19s, 19d which are electrically connected to the conductive regions 11g', 11s', 11d', respectively.

According to the embodiments of the inventive concept, lattice defects may be generated in predetermined regions of an insulating layer even without the formation of contact holes that penetrate the insulating layer, and the insulating layer having the lattice defects are rapidly quenched to additionally accelerate generation of the lattice defects. As a result, the predetermined regions of the insulating layer are converted into conductive regions having low electrical resistance. Therefore, the conductive regions may act as contact plugs. Accordingly, reliable contact structures can be formed which are suitable for a highly integrated semiconductor device.

Although the present invention is described in connection with the embodiments as set forth above, it is not limited thereto. It will be apparent to those skilled in the art that various substitutions, modifications and changes may be made without departing from the scope and spirit of the invention.

What is claimed is:

1. A method of forming a semiconductor device, comprising:
    forming an insulating layer on a semiconductor substrate;
    selectively implanting impurity ions into a predetermined region of the insulating layer to generate lattice defects in the predetermined region of the insulating layer; and
    forming a conductive region having current paths in the predetermined region by performing a thermal treatment on the insulating layer having the lattice defects to accelerate generation of the lattice defects in the predetermined region,
    wherein the thermal treatment comprises quenching the insulating layer at a predetermined temperature change rate.

2. The method of claim 1, wherein the predetermined temperature change rate is at least −20° C./minute.

3. The method of claim 1, wherein the insulating layer is one of a silicon oxide layer, a silicon nitride layer, and a silicon oxynitride layer.

4. The method of claim 1, wherein selectively implanting the impurity ions into the predetermined region of the insulating layer comprises:
    forming on the insulating layer a mask pattern having an opening which exposes the predetermined region;
    implanting the impurity ions into the predetermined region through the opening; and
    removing the mask pattern.

5. The method of claim 1, wherein the impurity ions comprise ions selected from phosphorus ions, arsenic ions, boron ions, or fluorine ions.

6. The method of claim 1, wherein the impurity ions are implantable by an electron beam.

7. The method of claim 1, wherein quenching the insulating layer is by immersing in de-ionized water the semiconductor substrate having the insulating layer.

8. The method of claim 1, wherein performing the thermal treatment comprises:
    loading in a diffusion furnace the semiconductor substrate having the insulating layer in which the impurity ions are implanted;
    heating the insulating layer in the diffusion furnace; and
    unloading the heated insulating layer,
    wherein unloading the heated insulating layer includes adjusting a movement speed of the semiconductor substrate having the heated insulating layer to quench the insulating layer at the temperature change rate of at least −20° C./minute.

9. The method of claim 1, further comprising:
    forming a conductive layer on the insulating layer having the conductive region; and
    patterning the conductive layer to form an interconnection line which is in contact with the conductive region.

10. The method of claim 1, further comprising:
    forming a MOS transistor including a gate electrode, a source region, and a drain region on the semiconductor substrate prior to formation of the insulating layer,
    wherein the predetermined region having the lattice defects is in contact with any one of the gate electrode, the source region, and the drain region.

11. The method of claim 1, wherein the impurity ions are implanted using a plurality of ion implantation processes with ion implantation energies different from each other.

12. A method of forming a current path in an insulating layer of a semiconductor device comprising:
    implanting impurity ions into the insulating layer to provoke initial lattice defects in areas where the ions are implanted such that the initial lattice defects provide a current path within the insulating layer, and
    performing a thermal treatment on the insulating layer having the initial lattice defects to accelerate generation of further lattice defects in the areas where the ions are implanted,
    wherein the thermal treatment comprises quenching the insulating layer at a predetermined temperature change rate.

13. The method of claim 12, wherein the initial defects lattice defects and the further lattice defects provide a current path through the insulating layer.

14. The method of claim 12, wherein the impurity ions are implanted with differing energies such that the initial lattice defects and further lattice defects are created at differing distances from a source of the impurity ion implantation.

15. The method of claim 12, wherein the impurity ions comprise ions selected from phosphorous ions, arsenic ions, boron ions, and fluorine ions.

16. The method of claim 12, wherein the impurity ions are implanted by an electron beam.

17. The method of claim 12,
    wherein the insulating layer has a first surface on which a contact plug is located and an opposing surface interfacing with an impurity region of a MOS transistor, and
    wherein the current path interconnects the contact plug to the impurity region.

18. The method of claim 13, wherein predetermined temperature change rate is at least −20° C./minute.

19. The method of claim 12, wherein the thermal treatment process comprises heating the insulating layer to a temperature higher than room temperature and then immersing the heated insulating layer in de-ionized cooling water having a room temperature or a temperature lower than room temperature.

20. The method of claim 12, wherein the thermal treatment process comprises:
    loading the insulating layer into a diffusion furnace;
    heating the insulating layer in the diffusion furnace; and
    unloading the heated insulating layer out of the diffusion furnace at a movement speed that rapidly quenches the heated insulating layer at the temperature change rate of at least −20° C./minute.

21. The method of claim 12, wherein the insulating layer is one of a silicon oxide layer, a silicon nitride layer, or a silicon oxynitride layer.

* * * * *